(12) United States Patent
Lin

(10) Patent No.: US 6,922,108 B2
(45) Date of Patent: Jul. 26, 2005

(54) ACTIVE BALUN CIRCUIT FOR SINGLE-ENDED TO DIFFERENTIAL RF SIGNAL CONVERSION WITH ENHANCED COMMON-MODE REJECTION

(75) Inventor: Jenshan Lin, Pine Brook, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 868 days.

(21) Appl. No.: 09/877,900

(22) Filed: Jun. 8, 2001

(65) Prior Publication Data

US 2002/0187768 A1 Dec. 12, 2002

(51) Int. Cl.[7] ................................................ H03F 3/45
(52) U.S. Cl. .................... 330/301; 330/258; 330/306
(58) Field of Search ................................ 330/252, 258, 330/301, 302, 306

(56) References Cited

U.S. PATENT DOCUMENTS

| | | | | |
|---|---|---|---|---|
| 6,057,714 A | * | 5/2000 | Andrys et al. | 327/105 |
| 6,252,460 B1 | * | 6/2001 | Ito | 330/301 |
| 6,441,688 B1 | * | 8/2002 | Lau et al. | 330/301 |

OTHER PUBLICATIONS

*Novel Active Differential Phase Splitters in RFIC for Wireless Applications*, by Huainan Ma, Sher Jiun Fang, Fujiang Lin and Hiroshi Nakamura, IEEE Transactions On Microwave Theory And Techniques, vol. 46, No. 12, Dec. 1998.
*A Novel HBT Active Transformer Balanced Schottky Diode Mixer*, by Kevin W. Kobayashi, 1996 IEEE MTT–S Digest, pp. 947–950.
*Digital cellular telecommunications system (Phase 2+); Radio transmission and reception (GSM 05.05 version 5.5.1)*, by European Telecommunications Standards Institute (ETSI), Third Edition, Jan. 1998, pp. 1–50.

* cited by examiner

*Primary Examiner*—Steven J. Mottola

(57) ABSTRACT

An active balun circuit is provided for single-ended to differential RF signal conversion with enhanced common-mode rejection which suppresses common mode signal and which achieves phase and amplitude balance without sophisticated tuning or compensation methods. The circuit has a single-ended input and balanced output with phase and amplitude balance error less than 2° and 1.2 dB, respectively, measured from 1.5 GHz to 1.8 GHz at 5V supply. When supply voltage drops down to 1.5V, its phase and amplitude balance error remains within 5° and 2 dB, respectively. The circuit achieves a balanced output via an output network which behaves as an impedance matching network for differential mode signal and is grounded for common mode signal. As a result, common mode signal is suppressed and 180-degree phase balance at output is achieved. The circuit has high-linearity (P1 $dB_{in}$=5 dBm, IIP3=16.6 dBm) and low residual phase noise (<−155 dBc/Hz at 100 kHz and above) which make it suitable as an active balun/buffer amplifier between LO and balanced mixer for base station receiver applications.

15 Claims, 1 Drawing Sheet

ACTIVE BALUN CIRCUIT FOR SINGLE-ENDED TO DIFFERENTIAL RF SIGNAL CONVERSION WITH ENHANCED COMMON-MODE REJECTION

BACKGROUND OF THE INVENTION

1. Field of the Invention

The present invention relates generally to the field of integrated circuits and subsystems. Specifically, the present invention relates to an active balun circuit for single-ended to differential RF signal conversion with enhanced common-mode rejection.

2. Description of the Related Art

A differential-pair amplifier can be used in integrated circuits as an active balun when single-ended to differential conversion is needed, e.g., the radio-frequency (RF) and local oscillator (LO) ports of balanced mixers. The challenge is to maintain its phase and amplitude balance at high frequency when parasitic effects degrade its performance. Several techniques have been reported to improve the phase and amplitude balance as well as the bandwidth.

However, for integrated circuits used in wireless communications, narrow band response is a preferred feature because it helps reject unwanted signals. For example, a narrow band balun, i.e., a passive device with distributed electrical constants for coupling a balanced system or device to an unbalanced system or device, placed between a low-noise amplifier (LNA) and mixer will help reject out-of-band interference signals and the balun placed between the LO and mixer will reduce harmonics from LO. If these interference signals or harmonics enter the mixer, they may create higher order intermodulation products that can block the wanted signal. When broadband is not a design target, narrow band techniques can be used to achieve better performance in a specific frequency range.

On the other hand, an active balun has limited dynamic range when compared to its passive counterpart. In order to increase its linearity under limited supply voltage, large transistors with large current bias have to be used. This increases its parasitic capacitance and affects signal balance due to common-mode leakage or signal at high frequency.

SUMMARY OF THE INVENTION

The present invention provides an active balun circuit for single-ended to differential RF signal conversion with enhanced common-mode rejection. The circuit includes a differential pair amplifier with single-ended input and balanced output. The circuit achieves a balanced output via an output network which behaves as an impedance matching network for a differential mode signal and is grounded for a common mode signal. As a result, the common mode signal is suppressed and 180-degree phase balance at output is achieved.

The circuit further includes a parallel inductor-capacitor (LC) band stop resonator between an emitter-coupled node and a current source that has a very large impedance looking into the current source at the emitter-coupled node, so that the output signal balance is not affected and additional DC voltage drop is not created.

Advantageously, the active balun circuit for single-ended to differential RF signal conversion with enhanced common-mode rejection of the present invention suppresses common mode signal and achieves phase and amplitude balance without sophisticated tuning or compensation methods. Further the circuit of the present invention achieves high linearity and low residual phase noise simultaneously.

BRIEF DESCRIPTION OF THE DRAWING

The invention is further explained by way of example and with reference to the accompanying drawing, wherein.

DETAILED DESCRIPTION

I. Description of the Circuit

Figure 1:
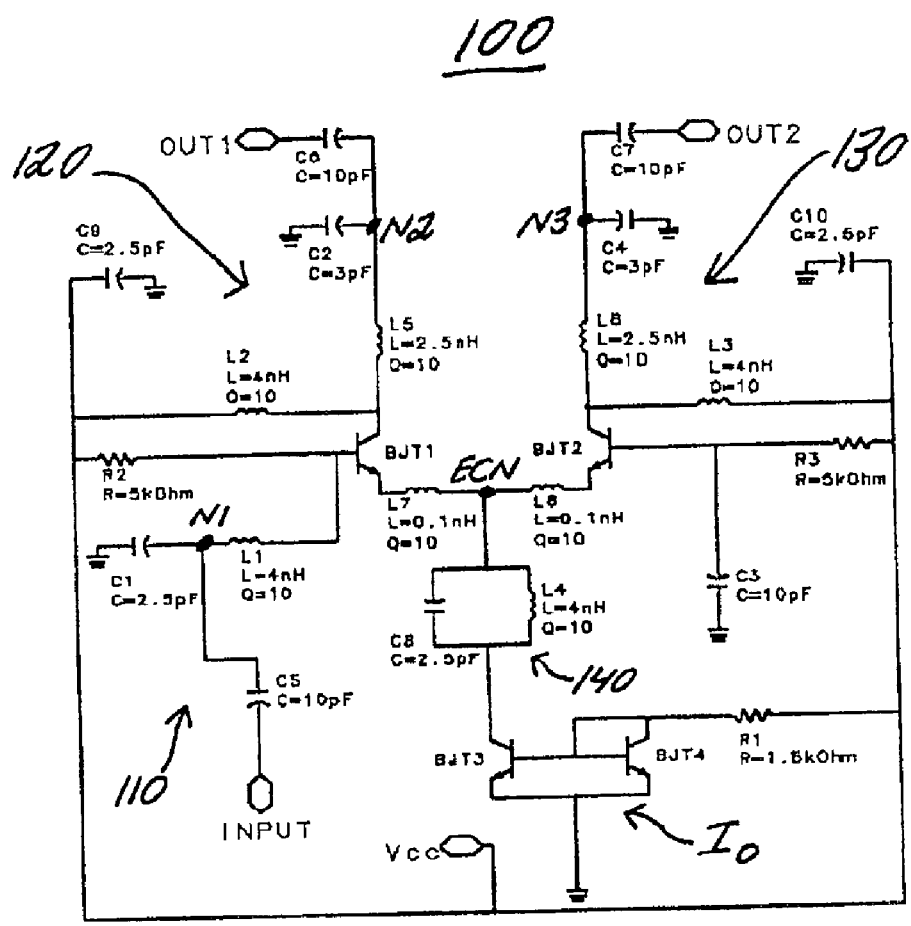
FIG. 1 is a schematic diagram of the circuit according to the present invention.

FIG. 1 is a circuit schematic of the circuit according to the present invention. The circuit is designated generally by reference numeral 100. It is a differential pair amplifier with single-ended input and balanced output.

The circuit 100 includes a parallel inductor-capacitor (LC) band stop resonator 140 between the emitter-coupled node ECN and the current source Io. The LC band stop resonator 140 includes a capacitor C8 connected in parallel with an inductor L4 which filter out the unwanted parasitic parameters, e.g., parasitic capacitance or oscillations, at RF frequency. A first terminal of the LC band stop resonator 140 is connected to the emitter-coupled node ECN and a second terminal of the LC band stop resonator 140 is connected to a collector of the transistor BJT3. A first terminal of a resistor R1 is connected to the base of the transistors BJT3, BJT4 and a collector of the transistor BJT4. A second terminal of the resistor R1 is connected to Vcc.

Advantageously, the LC band stop resonator 140 increases the impedance looking into the current source Io of the circuit 100 at resonant frequency without creating additional DC voltage drop. Since the output signal balance is very sensitive to this node ECN, parasitic inductance at the differential pair emitters needs to be included in the design. Based on the length of the interconnect, a specific inductance is calculated and added at each emitter by connecting inductors L7 and L8 to each emitter of transistors BJT1, BJT2, respectively.

To reduce the high frequency out-of-band interference signal generated by the circuit 100 and LO harmonics coming into the mixer via the output terminals OUT1, OUT2 and producing in-band intermodulation products, it is desired to only pass the low frequency signals to the mixer. This is achieved by using LC networks 110, 120, 130 for both input and output matching.

The LC networks 110, 120, 130 include an input LC network 110 which includes an INPUT node connected to a first terminal of a capacitor C5. A second terminal of the capacitor C5 is connected to a node N1 connecting a first terminal of a capacitor C1 with a first terminal of an inductor L1. A second terminal of the capacitor C1 is connected to ground and a second terminal of the inductor L1 is connected to a base of the transistor BJT1.

A first output LC network 120 includes an output node OUT1 connected to a first terminal of a capacitor C6. A second terminal of the capacitor C6 is connected to a node N2 connecting a first terminal of a capacitor C2 with a first terminal of an inductor L5. A second terminal of the capacitor C2 is connected to ground and a second terminal of the inductor L5 is connected to a collector of the transistor BJT1.

The first output LC network 120 further includes a capacitor C9 having a first terminal connected to ground and a second terminal connected to Vcc; and an inductor L2 having a first terminal connected to the collector of the transistor BJT1 and a second terminal connected to the second terminal of the capacitor C9 and Vcc.

A second output LC network 130 includes an output node OUT2 connected to a first terminal of a capacitor C7. A second terminal of the capacitor C7 is connected to a node N3 connecting a first terminal of a capacitor C4 with a first terminal of an inductor L6. A second terminal of the capacitor C4 is connected to ground and a second terminal of the inductor L6 is connected to a collector of the transistor BJT2.

The second output LC network 130 further includes a capacitor C10 having a first terminal connected to ground and a second terminal connected to Vcc; and an inductor L3 having a first terminal connected to the collector of the transistor BJT2 and a second terminal connected to the second terminal of the capacitor C10 and Vcc.

A first terminal of a resistor R2 is connected to the base of the transistor BJT1 and the second terminal of the inductor L1. A second terminal of the resistor R2 is connected to the second terminal of the capacitor C9 and Vcc. A first terminal of a resistor R3 is connected to the base of the transistor BJT2 and a second terminal of the resistor R3 is connected to the second terminal of the capacitor C10 and Vcc. A first terminal of a capacitor C3 is connected to ground and a second terminal of the capacitor C3 is connected to the base of the transistor BJT2 and the first terminal of the resistor R3.

In one exemplary embodiment of the invention, capacitors C1, C8, C9 and C10 have a capacitance of 2.5 pF; capacitors C2 and C4 have a capacitance of 3 pF; capacitors C3, C5, C6 and C7 have a capacitance of 10 pF; inductors L1, L2, L3 and L4 have an inductance of 4 nH; inductors L5 and L6 have an inductance of 2.5 nH; inductors L7 and L8 have an inductance of 0.1 nH; resistor R1 has a resistance of 1.5 Kohms; and resistors R2 and R3 have a resistance of 5 Kohms. These values are shown in FIG. 1 for pedagogical purposes.

The circuit 100, including the transistors BJT1–4, may be fabricated using a 0.25 µm silicon BiCMOS process with peak $f_T$ around 35 GHz. All components in FIG. 1 may be integrated on-chip. However, using current technology, typically the two DC blocking capacitors C6, C7 at output would not be integrated on the chip. The chip may be fabricated from BiCMOS. Since low residual phase noise is required when the circuit 100 is used as LO buffer amplifier, bipolar junction transistors, with lower inherent 1/f noise, are used for transistors BJT1–4.

It is contemplated that the circuit 100 and the transistors BJT1–4 can be fabricated using other types of circuit fabrication and transistor technologies, besides BiCMOS and bipolar, including, but not limited to, CMOS, MOSFET, MESFET, HBT and HEMT.

When supply voltage and current is limited, the circuit 100 can also be biased at lower voltage with lower amplifier gain and linearity, and slight degradation in signal balance. Nevertheless, the circuit 100 is optimized for high input $P_{1dB}$ at Vcc=5V.

II. Operation

During operation, at differential mode, the power supply Vcc is virtual ground, and both capacitors C9 and C10 have no function because both of their terminals are grounded. In this case, inductors L2 and L5 and capacitor C2 form an output impedance matching network for OUT1 and inductors L3 and L6 and capacitor C4 form an output impedance matching network for OUT2.

At common mode, since the first output LC network 120 and the second output LC network 130 are symmetrical, they can be split at Vcc node. For the first output LC network 120, inductor L2 and capacitor C9 become short circuited to ground at the circuit's resonant frequency, which is the frequency the circuit 100 is designed to operate at. Therefore, the output of transistor BJT1 is shorted to ground and the first output LC network 120 is grounded. For the second output LC network 130, inductor L3 and capacitor C10 also become short circuited to ground at the circuit's resonant frequency. Therefore, the output of transistor BJT2 is shorted to ground and the second output LC network 130 is grounded. Hence, common mode signal at output is suppressed.

Hence, the circuit 100 achieves a balanced output via an output network which includes the first and second output LC networks 120, 130. The output network behaves as an impedance matching network for differential mode signal and is grounded for common mode signal. As a result, common mode signal is suppressed and 180-degree phase balance at output is achieved.

The circuit 100 achieves both good signal balance and high dynamic range in an active balun with a simple topology. For example, the circuit 100 can be operated using the values shown in FIG. 1 from 1.5V to 5V, with its phase and amplitude balance error within 5° and 2 dB in the frequency range from 1.5 GHz to 1.8 GHz. At 5V supply, the circuit 100 has phase and amplitude balance error less than 2° and 1.2 dB, respectively. Input $P_{1dB}$ of 5 dBm and input IP3 of 16.6 dBm is achieved at 5V supply and residual phase noise is better than −155 dBc/Hz at 100 kHz offset and above.

The circuit's high-linearity (P1 $dB_{in}$=5 dBm, IIP3=16.6 dBm) and low residual phase noise (<−155 dBc/Hz at 100 kHz and above) make it suitable as an active balun/buffer amplifier between a local oscillator (LO) and balanced mixer for base station receiver applications. That is, the circuit 100 can be used as an active balun between a single-ended low-noise amplifier (LNA) and a balanced mixer, where the input terminal INPUT is configured for connection to the single-ended LNA and the output terminals OUT1, OUT2 are configured for connected to the balanced mixer, or an active balun/buffer amplifier between a single-ended LO and a balanced mixer for base station receiver applications, where the input terminal INPUT is configured for connection to the single-ended LO and the output terminals OUT1, OUT2 are configured for connection to the balanced mixer. The LO is generally used in communications systems to down or up convert a signal from one frequency to another. The circuit 100 demonstrated the feasibility of achieving both good signal balance and high dynamic range in an active balun with a simple topology.

Although the illustrative embodiments of the present disclosure have been described herein with reference to the accompanying drawing, it is to be understood that the disclosure is not limited to that precise embodiment, and that various other changes and modifications may be affected therein by one skilled in the art. For example, one skilled in the art can appreciate the use of components having different measured parameters as the components described herein with reference to FIG. 1, in order for the circuit 100 to operate substantially the same at other frequencies as at the frequencies, i.e., 1.5–1.8 GHz, described herein. That is, those skilled in the art will envision other modifications within the scope and spirit of the claims appended hereto.

What is claimed is:

1. A circuit comprising:
   an input inductor-capacitor (LC) circuit;
   a first and a second output inductor-capacitor (LC) circuit;
   a first transistor connected to the input LC circuit and the first output LC circuit; and a second transistor connected to the first transistor and the second output LC circuit;

wherein in differential mode said first and second output LC circuits each form an output impedance matching network for first and second output terminals, respectively, and in common mode said first and second output LC circuits are grounded solely by operation of said circuit.

2. The circuit according to claim 1, wherein the circuit is adapted for connection via an input terminal to one of the group consisting of a single-ended low-noise amplifier (LNA) and a single-ended local oscillator (LO).

3. The circuit according to claim 1, wherein an emitter of the first transistor and an emitter of the second transistor are coupled via two inductors.

4. The circuit according to claim 3, wherein an inductor-capacitor (LC) band stop resonator circuit is coupled to a node connecting the two inductors and to a current source.

5. The circuit according to claim 4, wherein the LC band stop resonator circuit includes a capacitor coupled in parallel to an inductor.

6. The circuit according to claim 1, wherein each base of the first and second transistors is coupled to a respective resistor.

7. The circuit according to claim 1, wherein each output LC circuit includes an output capacitor coupled to a respective output terminal of the first and second output terminals.

8. The circuit according to claim 1, wherein the input LC circuit includes an input capacitor coupled to an input terminal.

9. The circuit according to claim 1, wherein each collector of the first and second transistors is coupled to a respective inductor and to one of the first and second output LC circuits.

10. The circuit according to claim 1, wherein a base of the first transistor is coupled to the input LC circuit.

11. A circuit comprising:
means for providing a low-pass frequency response of signals received from a single-ended device; and
means for providing as an output two balanced signals as a function of the low-pass frequency response of the signals received from the single-ended device, said means for providing two balanced signals including a differential pair amplifier means having a balanced output and a single-ended input coupled to the means for providing the low-pass frequency response, wherein the differential pair amplifier means includes first and second transistors having their emitters coupled via two inductors forming an emitter-coupled node.

12. The circuit according to claim 11, wherein the differential pair amplifier means includes at least one DC blocking capacitor.

13. The circuit according to claim 11, wherein the emitter-coupled node is coupled to a first terminal of an inductor-capacitor (LC) band stop resonator having a capacitor connected in parallel to an inductor, a second terminal of the LC band stop resonator is coupled to a current source coupled to ground and a voltage power supply.

14. A method for converting a single-ended signal received by a circuit to a differential radio-frequency (RF) signal, the method comprising the steps of:
operating the circuit at a differential mode to convert the single-ended signal to the differential RF signal and to form an output impedance matching network with first and second output inductor-capacitor (LC) circuits of the circuit
operating the circuit at a common mode to ground said first and second output LC circuits; and
coupling an LC band stop resonator circuit to a node in the circuit connecting two inductors with a current source.

15. The method according to claim 14, wherein the first and second output LC circuits of the circuit are part of a differential amplifier.

* * * * *